Jan. 1, 1963 M. W. BANG 3,071,742

APPARATUS FOR TUNING A RADIO FREQUENCY

Filed Nov. 17, 1960 5 Sheets-Sheet 1

INVENTOR.
Mogens W. Bang
BY Webb, Mackey & Burden
HIS ATTORNEYS

Jan. 1, 1963 M. W. BANG 3,071,742

APPARATUS FOR TUNING A RADIO FREQUENCY

Filed Nov. 17, 1960 5 Sheets-Sheet 2

INVENTOR.
Mogens W. Bang
BY
Webb, Mackey & Burden
HIS ATTORNEYS

APPARATUS FOR TUNING A RADIO FREQUENCY

Filed Nov. 17, 1960 5 Sheets-Sheet 3

INVENTOR.
Mogens W. Bang
BY Webb, Mackey & Burden
HIS ATTORNEYS

APPARATUS FOR TUNING A RADIO FREQUENCY

Filed Nov. 17, 1960 5 Sheets-Sheet 4

INVENTOR.
Mogens W. Bang
BY
Watt, Mackey & Burden
HIS ATTORNEYS

Jan. 1, 1963 M. W. BANG 3,071,742

APPARATUS FOR TUNING A RADIO FREQUENCY

Filed Nov. 17, 1960 5 Sheets-Sheet 5

INVENTOR.
Mogens W. Bang

BY [signature]

HIS ATTORNEYS

United States Patent Office 3,071,742

Patented Jan. 1, 1963

3,071,742

APPARATUS FOR TUNING A RADIO FREQUENCY

Mogens Wiel Bang, Hubbard, Ohio, assignor to Liberty Manufacturing Corporation, Youngstown, Ohio, a corporation of Ohio Filed Nov. 17, 1960, Ser. No. 69,924
6 Claims. (Cl. 334—50)

This application, which is a continuation-in-part of my copending application Serial No. 620,741, filed November 6, 1956, now Patent No. 2,979,615, relates to apparatus for tuning a radio frequency. More particularly, it relates to apparatus for tuning a wide range of frequencies in which components for varying the frequency of electronic equipment are connected into the main tuning circuitry of the equipment in sets so that the frequency of the tuner and, therefore, of the equipment is changed by steps rather than continuously. My invention has a number of applications in electronic equipment, for example, measuring equipment, multiple frequency range radio transmitters and receivers, tuners for television receivers, etc. My invention is particularly useful in tuners for television receivers and, therefore, it will be described with reference thereto.

My invention is useful in television receivers designed for very high frequencies, receivers designed for ultrahigh frequencies and receivers designed for both very high and ultrahigh frequencies. It is particularly useful in the last mentioned type of receiver because, as will be later explained, it makes it possible for such a receiver to receive by step tuning not only all of the presently used very high frequency channels but also all of the ultrahigh frequency channels.

In television receivers for very high frequencies employing so-called step tuning, groups of components, such as capacitors and inductances, are connected into the main circuitry of the tuner, one group at a time, to adjust the tuner to different frequencies. Each group is mounted on a strip of dielectric material, the assembly being known as a "tuner strip" or "tuning strip." The tuner strips have contacts which engage fixed contacts connected into the main circuitry of the tuner. The strips are moved so that the contacts on the strips engage the fixed contacts one strip at a time. As each strip is thereby connected into the main circuitry of the tuner, the frequency of the tuner is changed in steps.

Due to various factors, such as atmospheric conditions, age of components, etc., when a tuner is adjusted to a particular frequency by connecting a tuner strip into the main tuner circuitry, the tuner is not necessarily adjusted to the exact frequency desired. To compensate for the maladjustment, tuners heretofore used have included a trimmer in the main tuner circuitry which is adjusted by a separate control mechanism and knob to "fine tune" the main tuner circuitry in order to receive the desired frequency. Whenever the tuner is switched to a different frequency by connecting a different tuner strip into the main tuner circuitry, the tuner may again be out of correct adjustment because the adjustment of the trimmer which was made for the first frequency is not correct for the second frequency. If this occurs, then it is again necessary to "fine tune" the tuner for the second frequency. If now the tuner is switched back to the first frequency, then the trimmer must again be adjusted for the first frequency. My invention eliminates the necessity of "fine tuning" each time the tuner is switched to a different frequency or channel by avoiding adjustments to the main tuner circuitry. In accordance with my inventon, whenever a channel is once selected and "fine tuned," the fine tuning adjustment for that channel will hold even though ths tuner is switched to other channels and then brought back to the first channel or frequency selected.

In addition to the 12 very high frequency channels now in use, there are also available 70 ultrahigh frequency channels, certain channels ony, however, being assigned to particular localities. The large number of ultrahigh frequency channels creates a special problem in the design of step tuners for ultrahigh frequency receivers. If present designs of step tuners are employed, it is not possible to install 70 groups of components or "tuner strips," as they are called, one of each channel. A tuner having such a large number of strips would be impossibly large. The result is that television receiver manufacturers have resorted either to continuous tuning, which is very difficult for the average television viewer to carry out because it requires trial and error methods to tune to a desired frequency, or they have provided in a step tuner for a limited number of fixed ultrahigh frequency positions and have thus allowed for only a limited number of ultrahigh frequency channels which the receiver can tune to. Receiver manufacturers favoring the latter approach have, therefore, been compelled to send out television receivers having ultrahigh frequency tuner strips which vary with the locality to which the receivers are shipped. This creates a distribution problem. An alternative course has been to send out the receivers without tuner strips and to supply local dealers with strips appropriate for the area in which the dealers are located. The dealer then adds the correct strips to the sets which he sells. This adds to the cost of the receiver. Moreover, whenever, the owner of a television receiver moves from one locality to another, it is necessary to have a serviceman change the strips in the tuner of the set. This calls for an expensive and, therefore, objectionable service call.

My invention provides ultrahigh frequency tuning strips, each of which carries components which can be adjusted to a range of frequencies by the operator. Stated differently, in accordance with my invention, one tuning strip can be used to adjust the tuner to many frequencies. The result is that an operator in any locality, who uses a tuner having only a few of these multiple frequency strips and the control mechanism therefor, can locate the few ultrahigh frequency channels receivable in his locality, using one strip for each channel, and can thereafter step-tune those channels, inasmuch as each strip then represents a pretuned channel in the ultrahigh frequency range which is receivable in his locality.

In my said copending application Serial No. 620,741, I describe and claim a single control mechanism which is used by the tuner operator first, to bring the contacts of any one tuner strip into engagement with the fixed contacts of the main circuitry of the tuner, and second, to reach each of the multiple frequency strips through the tuner housing whenever it is desirable to change the particular channel being received on the strip and also to reach the very high frequency strips for fine tuning purposes. In reaching and adjusting either type of strip, the operation of this single control mechanism remains the same. This application is directed to the construction of the tuner strip.

In the accompanying drawings, I have illustrated certain presently preferred embodiments of my invention, in which.

In a tuner embodying my invention, there is a plurality of tuner strips, each of which carries a plurality of components which are connected into the main circuitry, one strip at a time, to adjust the tuner to various frequencies. The strips each carry contacts connected to the components on the strips and these strips are moved in the tuner so that the contacts on the strips engage fixed contacts connected into the main tuner circuitry. My tuner strips can be used in any tuner employing such strips. However, I prefer to use a multiple position switch such as is described and claimed in my United States Patent No. 2,813,935. In this switch, the individual strips are mounted on two continuous flexible belts, each of which moves over two sprockets spaced from each other with one sprocket vertically above the other. The contacts on the strips engage fixed contacts directly above the center line of the upper sprocket so that there is adequate space for adjusting one or more of the components on the strip.

Figure 1:
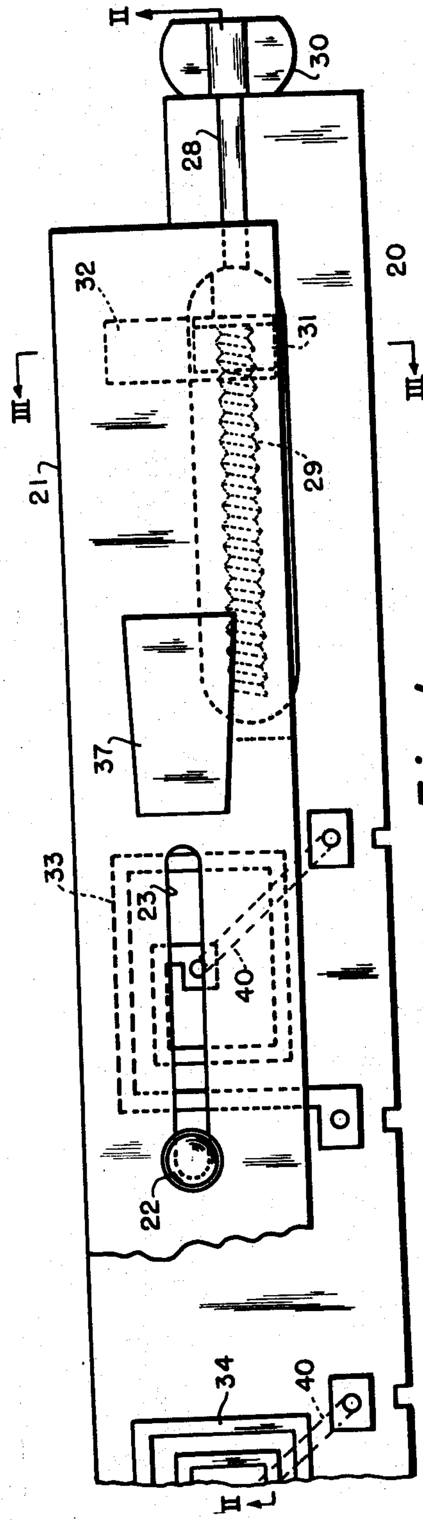
FIGURE 1 is a partial plan view of a tuning strip which I have invented.
Figure 2:
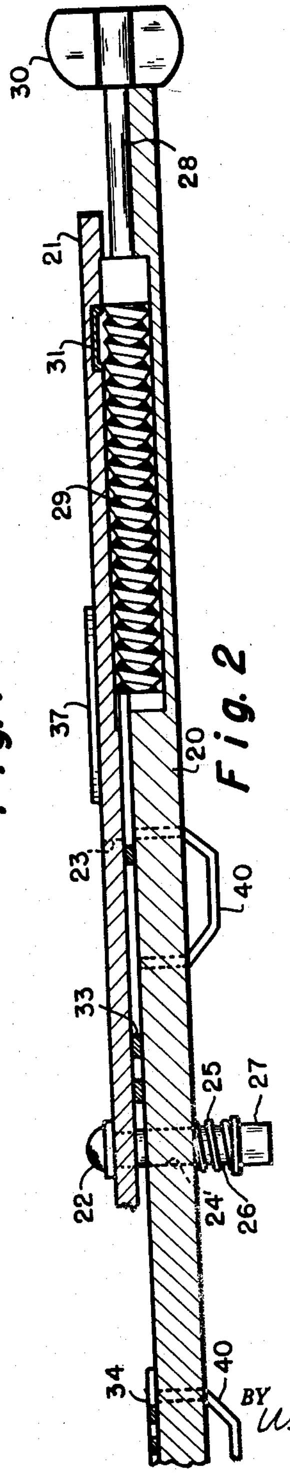
FIGURE 2 is a section along the lines II—II of FIGURE 1.
Figure 3:
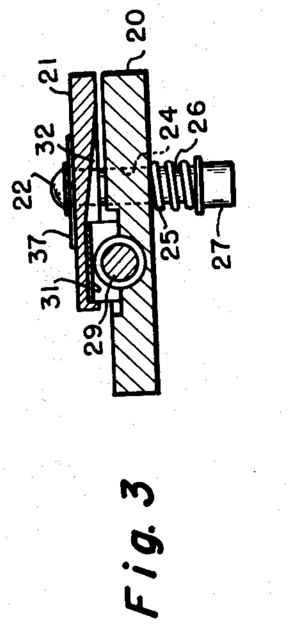
FIGURE 3 is a section along the lines III—III of FIGURE 1.

Referring to FIGURES 1 to 3, inclusive, a tuner strip embodying my invention comprises two elongated strips 20 and 21 of dielectric material. As will be later described, one of these strips carries "printed circuits" on one or both sides and the other strip carries one or more shields for adjusting the circuits carried on the first strip. Preferably, these shields are also formed by printing.

The two strips 20 and 21 are held against each other side by side and may be slid lengthwise of each other. The strips are held by pins 22 spaced along their lengths. The pins pass through slots 23 in the strip 21 which carries the shields and holes 24 in the strip 20 which carries the printed circuitry. The pins 22 extend beyond the surface of the strip 20 away from the strip 21 and carry compression springs 25 which press against the surface of the strip 20 and against a washer 26 held on the end of the pin 22 by flattening the end 27 of the pin. The springs 25 thus press the two strips 20 and 21 against each other with a slight pressure and, by reason of the slots 23, the strips can move relative to each other lengthwise over a limited distance.

In a tuner embodying my invention, the dielectric strip 20 is fixedly secured to the mechanism for switching the tuner strips in the tuner and the dielectric strip 21 is moved relative to the tuner strip 20. In order to adjustably move the strip 21, I provide a shaft 28 rotatably mounted in the strip 20 and having at one end an enlarged threaded portion 29 and at the other end a serrated head 30 which can be engaged and turned by mechanism described in my said copending application Serial No. 620,741, now Patent No. 2,979,615. A nut 31 mounted in a transverse slot 32 in the strip 21 engages the threaded portion 29 of the shaft 28. Rotation of the shaft 28 thereby causes the strip 21 to move relative to the strip 20.

Referring to FIGURE 2, it will be seen that the strips 20 and 21 are mounted relative to each other so that printed circuits are on the surface of the strip 20 which is between the two strips 20 and 21, one such circuit being shown at 33 in FIGURE 2. The outer surface of the strip 21, i.e., the surface away from the strip 20, carries shields for the components which are printed on the inside surface of the strip 20, one such shield being shown at 37 in FIGURE 2.

Figures 4, 5:
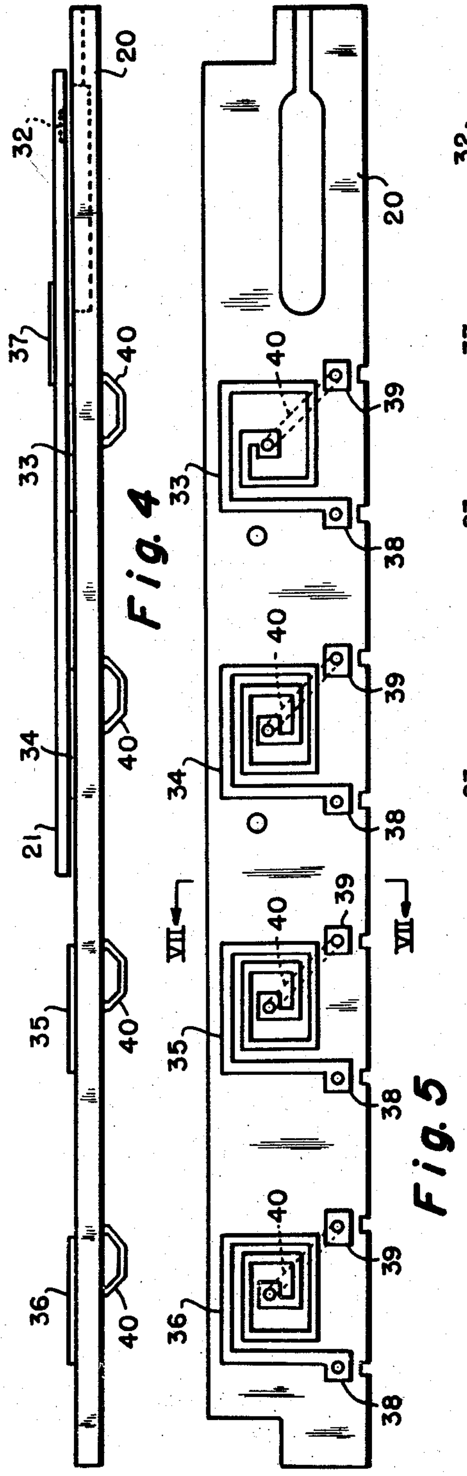
FIGURES 4, 5 and 6 are diagrammatic showings of circuits carried on my tuning strip for tuning to very high frequencies.
Figure 6:
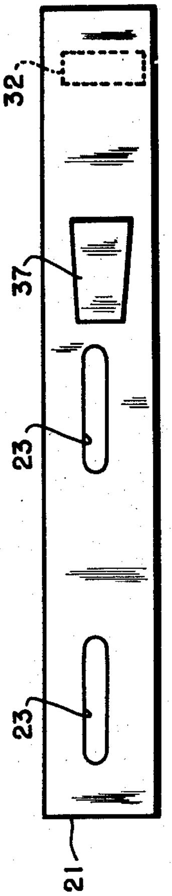

FIGURES 4 to 6, inclusive, illustrate diagrammatically the arrangement of the printed circuits and of the shield for a tuner strip designed to receive a very high frequency channel. On one surface of the strip 20, there is printed a series of inductances or capacitors, depending on the circuitry, 33, 34, 35 and 36, which are spaced along the length of the surface of the strip and insulated from each other by reason of the fact that the strip 20 is made of dielectric material. In the strip shown in FIGURES 4 to 6, inclusive, the coil 36 is connected to the antenna circuit, the coil 35 is in the plate circuit of the RF amplifier, the circuit coil 34 is in the mixer circuit, and the coil 33 is in the oscillating circuit of the main tuner circuitry.

In order to "fine tune" to a very high frequency broadcast, it is necessary to adjust only the oscillator circuit and, therefore, as shown in FIGURES 4 and 6, I provide only one shield 37, which is preferably "printed" on the strip 21. Referring to FIGURE 4, it will be seen that the shield 37 is spaced on the strip 21 relative to the oscillator coil 33 which is printed on the strip 20 so that the shield and the coil are in electrical relationship with each other. As the strip 21 is moved lengthwise relative to the strip 20, the shield 37 will vary the electrical value of the coil 33 and thereby the oscillator circuit can be adjusted.

Referring to FIGURE 6, the shield 37 is a plate of electrically conductive material, generally rectangular in area, having its longest dimension parallel to the length of the strip 21. It will also be noted that the dimension of the shield 37 which is at right angles to the direction of movement of the strip varies along the length of the shield so that the desired adjustment of the coil 33 can be obtained. As is well known, the shape of the shield can be designed to fit any ratio between frequency change and shield movement desired.

As shown in FIGURES 4 and 5, the inductances 33 to 36, inclusive, are in the form of flat coils of electrically conducting material, one end of each coil being positioned inside the coil. Preferably the coils are "printed" on the strip 20. The strip 20 also carries terminals 38 and 39 for each coil, the terminals 38 being formed integrally with the outer ends of the conductors forming the coils. The inner ends of each of the coils are connected to the terminals 39 by conductors 40. Contacts 38*a* and 39*a* are mounted on the edge of the strip and are soldered to the terminal 38 and 39 respectively. They extend beyond the edge of the strip and engage fixed contacts forming part of the main tuner circuitry as described in my said copending application Serial No. 620,741.

Figure 7:
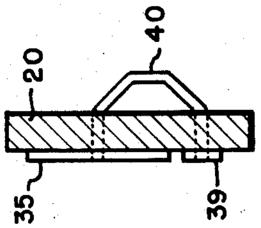
FIGURE 7 is a section along the lines VII—VII of FIGURE 5.
Figure 8:
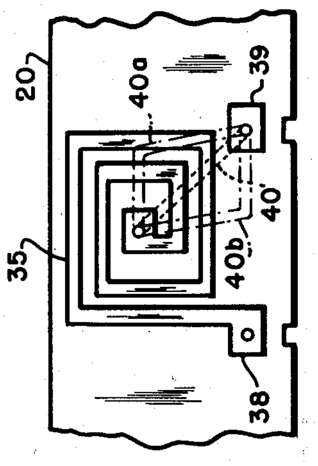
FIGURE 8 is a fragmentary view showing a portion of the tuning strip shown in FIGURE 5.

Referring to FIGURES 2, 4, and particularly FIGURE 7, it will be seen that the conductors 40 are on the side of the strip 20 opposite to that on which the coils are mounted. It will also be seen that the conductors 40 form a loop between the point of connection with the inner ends of the coil and the terminals 39. While the conductors 40 are thus spaced from the coils 35, they remain in electrical relationship with the coils so that the conductors 40 can be bent to vary the electrical value of the inductance or coil. Thus, if the conductor 40 is bent to the position shown in dotted lines at 40*a* in FIGURE 8, the value of the inductance is increased. If the conductor 40 is bent to the position shown in dotted lines at 40*b* in FIGURE 8, the value of the inductance 35 is decreased. By thus looping the conductors 40, I provide a means for "factory adjusting" the coils on the tuner strips to correct for any inaccuracies which may have developed during their manufacture prior to the assembly of a tuner embodying these coils.

Figure 9:
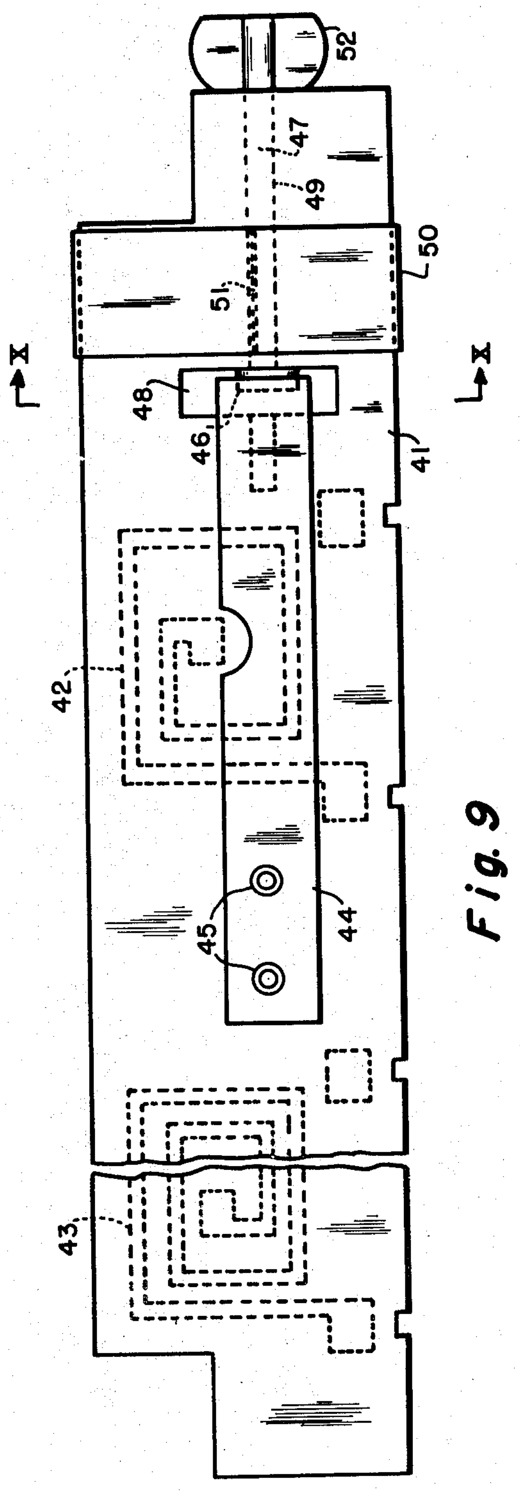
FIGURE 9 is a plan view of a modified form of tuning strip.
Figure 10:
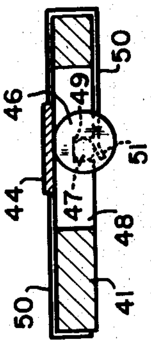
FIGURE 10 is a section along the lines X—X of FIGURE 9.

FIGURES 9 and 10 show a modified form of tuner strip which may be used for fine tuning a very high frequency in the same tuner switching mechanism described above. This tuner strip comprises a single layer of dielectric material 41 on one side of which components 42 and 43 are mounted in the same manner as the components 33 to 36 of the form of tuner strip shown in FIGURES 4 to 8, inclusive. On the opposite side of the strip 41 and in electrical relationship with the coil 42 which is connected into the oscillator circuit of a tuner, I secure a plate 44 of electrically conductive material. This plate 44 has sufficient resilience that, when held at one of its ends to the strip 41 by rivets 45, it will lie substantially flush with the side of the strip 41 to which it is secured. As shown in FIGURE 9, the plate 44 extends across the coil 42. They are on opposite sides of the strip 41 but they are in electrical relationship with each other so that, if the free end of the plate 44 is moved toward and away from the surface of the strip 41, the electrical value of the coil 42 will be changed. To move the plate 44 toward and away from the strip 41, I provide a cam disc 46 eccentrically mounted on one end of a shaft 47. The disc 46 is positioned in a transverse slot 48 cut in the strip 41 so that when the shaft 47 is turned to one angular position the disc 46 permits the free end of the plate 44 to lie substantially flush with the side of the strip 41. When the shaft is turned, the cam disc 46 moves the free end of the plate 44 away from the surface of the strip 41.

The shaft 47 lies in the groove 49 which extends longitudinally of the strip between the slot 48 and the end of the strip and is held in the groove by a spring clip 50 which extends substantially around the strip 41 and has one end 51 which presses against the shaft 47. The other end of the shaft 47 carries a serrated head 52 similar to the head 30.

Figure 11:
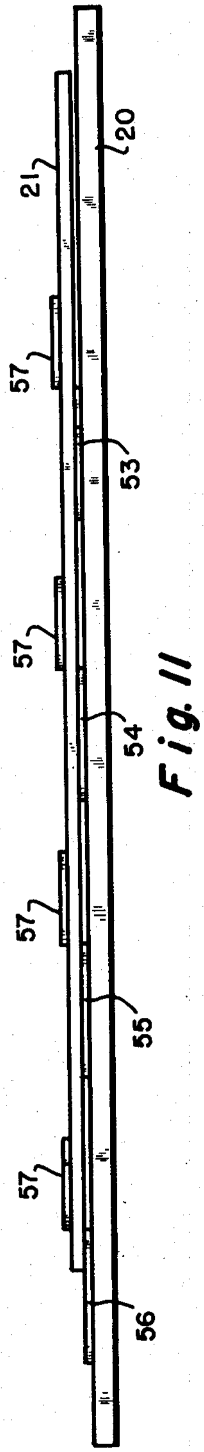
FIGURES 11, 12 and 13 are diagrammatic showings of circuits carried on my tuning strip for tuning to ultra-high frequencies.
Figure 12:
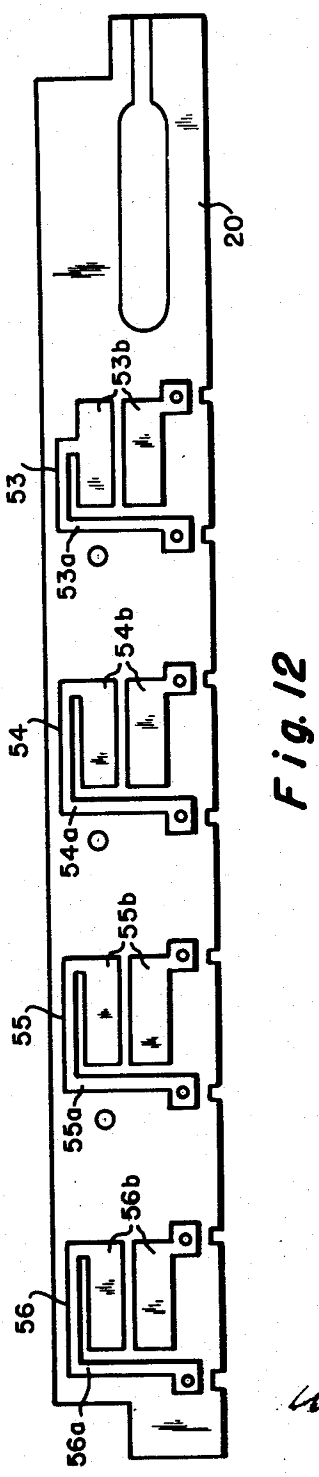
Figure 13:
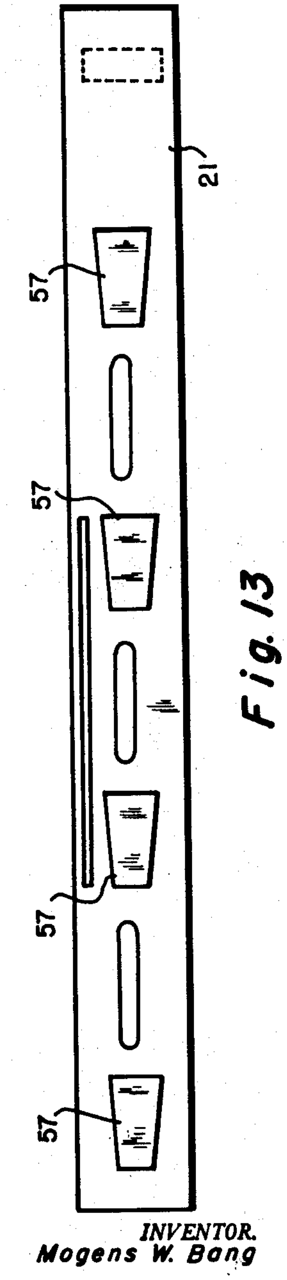

FIGURES 11, 12 and 13 show diagrammatically a tuning strip for tuning an ultrahigh frequency broadcast. The dielectric strip 20 carries four circuits 53, 54, 55 and 56, which correspond in position and function to the circuits 33 to 36, inclusive, of FIGURE 5. That is, circuit 56 is in the antenna circuit, circuit 55 is in the plate circuit of the RF amplifier, circuit 54 is the mixer circuit, and circuit 53 is in the oscillator circuit of the main tuner circuitry.

In each of these circuits 53 to 56, inclusive, the leg portions *53a*, *54a*, *55a* and *56a* constitute inductances and the plates *53b*, *54b*, *55b* and *56b* constitute capacitors.

The tuner strips which I employ for tuning ultrahigh frequencies are designed to tune a desired frequency within a certain range or band of frequencies. In this operation, all of the components on a strip are "gang tuned"; that is, they are all adjusted simultaneously. The mechanism which I have designed for this gang tuning is also used for fine tuning the desired frequency. Fine tuning is thus accomplished automatically and simultaneously with the locating of the desired frequency on the strip.

FIGURES 11 to 13 show a tuner strip for a range of ultrahigh frequencies in which all of the components on the strip can be adjusted simultaneously. I provide on the strip 21 a shield 57 in the form of a plate of electrically conductive material for each of the components on the strip. Referring to FIGURE 11, it will be seen that one of the shields 57 is positioned relative to one of the components 53 to 56, inclusive, so that it is in electrical relationship therewith. Movement of the strip 21 relative to the strip 20 and, therefore, movement of the shields 57 toward and away from the components on the strip 20 will affect the electrical value of those components.

A tuner strip for very high frequencies could be "gang tuned" in the same manner as has just been described for an ultrahigh frequency strip. This could be done to reduce the number of strips used in a tuner for tuning very high frequencies. Such a very high frequency strip would have a component arrangement such as is shown in FIGURE 5 and a strip having a shield for each component similar to the strip shown in FIGURE 13.

FIGURES 14 to 17 inclusive show a modified form of tuner strip. It comprises a strip 58 of dielectric material having three circuit components 59 which are similar to circuits 53–56 inclusive shown in FIGURES 11 and 12. The components 59 are connected to contacts 60 which are mounted on an edge of the strip 58. As is explained in my said copending application Serial No. 620,741, the contacts 60 engage fixed contacts forming part of the main tuner circuitry to connect the components 59 into that main circuitry.

The tuner strip also has a second strip of dielectric material 61 on which are mounted shields 62, one shield being provided for each component 59, and positioned so that each shield is in electrical relationship with the component to which it is adjacent. Movement of the strip 61 relative to the strip 58 will move the shields 62 relative to the components 59 and thereby effect the electrical value of the components.

Figure 14:
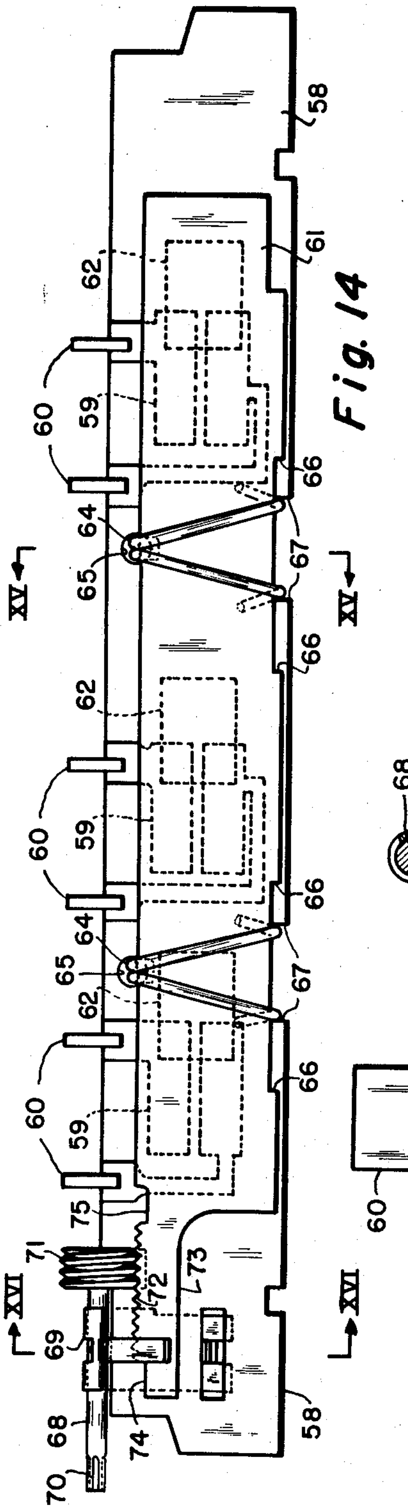
FIGURE 14 is a plan view of a second modified form of tuning strip.
Figure 15:
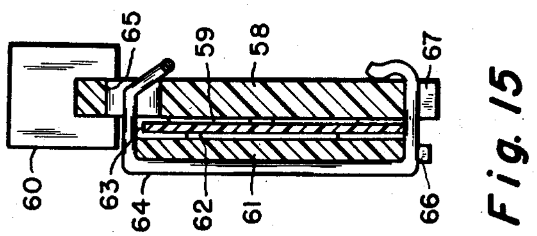
FIGURE 15 is a section along the lines XV—XV of FIGURE 14 but increased in scale.

The components 59 and the shields 62 are shown in dotted lines in FIGURE 14 because the sides of the strip on which these components and shields are printed face each other. It is therefore necessary to insert between the components and the shields a third strip 63 of dielectric material as is shown in FIGURE 15. Alternatively the sides of the strip on which the components and shields are printed could face in the same direction so that one of the dielectric strips 58 or 61 separates the components and shields.

The strips 58 and 61 extend parallel to and adjacent each other and are pressed toward each other by V-shaped spring clips 64. The apices of the clips extend through holes 65 in the strip 58 and as shown in FIGURE 15, are bent toward the longitudinal center line of the strip after passing through the openings 65 so as to engage the outer side or the side of the strip 58 which is not adjacent the strip 61. The two arms of the spring clips extend across the side of the strip 61 and pass through slots 66 formed in the edge of the strip 61 and slots 67 formed in the adjacent edge of the strip 58. After passing through the slots 66 and 67, the ends of the arms are bent toward the longitudinal center line of the strip 58 so as to engage the outer side of the strip 58. The clips 64 thus press the two strips 58 and 61 toward each other.

To move the strip 61 relative to the strip 58, I provide a shaft 68 which is rotatably mounted and held in position at one end of the strip 58 by a spring clip 69. One end of the shaft 68 extends beyond the end of the strip 58 and is serrated as is shown at 70 so that it can be engaged and turned by mechanism described in my said copending application Serial No. 620,741, now Patent No. 2,979,615. The inner end of the shaft 68 carries a worm gear 71 which meshes with a row of teeth 72 formed in an arm 73 extending from one end of the strip 61. As is clear from FIGURE 14 rotation of the shaft 68 will move the strip 61 lengthwise relative to the strip 58 and the shields 62 will move relative to the components 59 to vary their electrical value.

Figure 17:
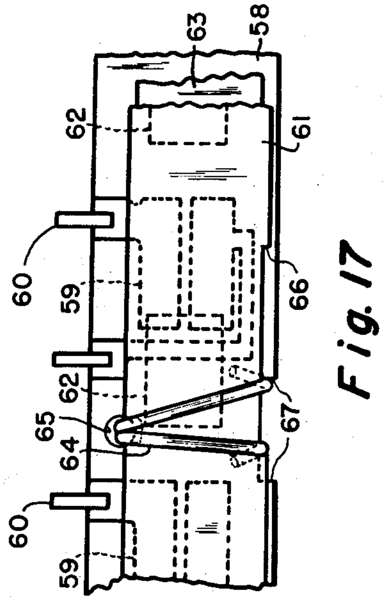
FIGURE 17 is a partial plan view of the tuning strip shown in FIGURE 14, but in a different operative position.
Figure 16:
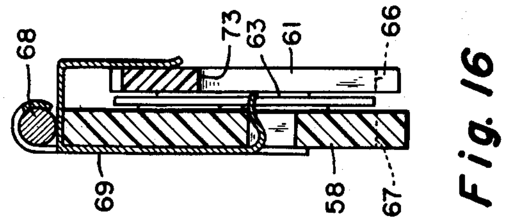
FIGURE 16 is a section along the lines XVI—XVI of FIGURE 14 but increased in scale.

Clearance spaces 74 and 75 are formed in the arm 73 at the ends of the row of teeth 72. These clearance spaces prevent the teeth on the gear 71 and the teeth in the row 72 from locking when the gear 71 reaches each end of the row of teeth. The diverging arms of the spring clips 64 press the worm gear 71 and the teeth in the row of teeth 72 against each other so that when the shaft 68 is turned to move the strip 61 away from each end of its path of travel, the teeth will engage. Referring to FIGURE 14, it will be seen that the slots 67 formed in the strip 58 are approximately as long as the distance between the diverging arms of the spring clips 64 when they pass through these slots and the slots 66 formed in the strip 61. The slots 66 have approximately the same length as the row of teeth 72. Therefore, when the shaft 68 is turned so as to bring the gear 71 into the clearance space 74 then the end of the slot 67 will engage the left-hand arms of the spring clips 64 as shown in FIGURE 17 and the spring action of the arm will tend to move the strip 61 to the left (viewing FIGURE 14) so as to press the teeth 72 against the teeth in the gear 71. Therefore, if the shaft 68 is turned in the correct direction, the teeth will engage and the strip 61 will be moved to the left (viewing FIGURE 14) and the gear 71 will not simply turn freely in the clearance space 74. When the gear 71 is in the clearance space 75, the same action takes place in reverse, the right-hand arms (viewing FIGURE 14) of the spring clips 64 pressing the teeth 72 against the teeth in the gear 71.

From the foregoing, it is obvious that my tuner strips have many advantages over similar mechanism now used in television tuners. In selecting any particular television channel, an operator can bring the particular strip required in contact with the main circuitry and then "fine tune" the strip if it is a very high frequency strip, or locate a new channel on the strip if it is an ultrahigh frequency strip. All this is done without disturbing the main tuner circuitry and thus without disturbing any similar adjustments previously made on the other strips in the tuner.

My invention is particularly advantageous for television receivers in the ultrahigh frequency range because it provides step tuning in this range for many different groups of different ultrahigh frequency channels, each group being selected by each operator according to the particular channels receivable in his locality. Once the particular channels receivable in a locality are located on the strips provided, the operator can thereafter switch from one preset ultrahigh frequency channel to another preset channel simply by turning the control knob one step-position at a time. He thus obtains step tuning in the ultrahigh frequency range for all of the receivable channels in his locality.

Moreover, when any strip is tuned to a particular ultrahigh frequency channel, it is also "fine tuned" to that channel and, since each tuner strip is adjusted independently of the other strips, the operator does not have to fine tune the receiver each time he changes the set to receive a different channel, which is necessary in ultrahigh frequency continuous tuning and also in all known designs of ultrahigh frequency step tuning.

A tuner embodying my tuner strips has the flexibility of adjustment of a continuous tuner without losing the desirable feature of step tuning. Thus, if a television receiver embodying my invention is moved from a locality having different ultrahigh frequency channels assigned to it, the owner of the set can adjust a tuner strip to each of the new channels in the new locality. Likewise, if a new channel is assigned to any particular locality or if the frequency of a channel is changed, the owner can make appropriate adjustments on one of the ultrahigh frequency tuner strips in the tuner.

While I have described certain presently preferred embodiments of my invention, it is to be understood that it may be otherwise embodied within the scope of the appended claims.

I claim:

1. In a tuner of a receiver for radio frequencies, mechanism for connecting into the main tuner circuitry a plurality of electrical components such as inductances and capacitors, said mechanism comprising a strip of dielectric material having on at least one surface and spaced from each other along the surface of the strip a plurality of components to be connected into said tuner circuitry, a second strip of dielectric material positioned parallel to and adjacent said first strip and having on one of its surfaces at least one plate of electrically conductive material, said strips being positioned relative to each other and said plate being spaced on the second strip relative to one of the components on the first strip so as to be in operative electrical relationship therewith, a shaft rotatably mounted on one of said strips and carrying gear teeth, a row of teeth carried by the other strip and meshing with the gear teeth on said shaft whereby rotation of the shaft moves one strip lengthwise relative to the other strip, and means for resiliently pressing the meshing teeth against each other in a direction opposite to the direction in which the strips move upon rotation of the shaft.

2. Mechanism for connecting electrical components into the main tuner circuitry as described in claim 1 in which the means for resiliently pressing the meshing teeth together comprises slots cut in adjacent edges of the strips, and at least one spring having two arms extending from adjacent the edges of the strips opposite to the edges having the slots and across a side of one strip and diverging away from each other in the direction of the slots and having ends extending through said slots.

3. In a tuner of a receiver for radio frequencies, mechanism for connecting into the main tuner circuitry a plurality of electrical components such as inductances and capacitors, said mechanism comprising a strip of dielectric material having on at least one surface and spaced from each other along the surface of the strip a plurality of components to be connected into said tuner circuitry, a second strip of dielectric material positioned parallel to and adjacent said first strip and having on one of its surfaces at least one plate of electrically conductive material, said strips being positioned relative to each other and said plate being spaced on the second strip relative to one of the components on the first strip so as to be in operative electrical relationship therewith, a shaft rotatably mounted on one of said strips and carrying gear teeth, a row of teeth carried by the other strip and meshing with the gear teeth on said shaft whereby rotation of the shaft moves one strip lengthwise relative to the other strip, a clearance space at each end of said row of teeth to prevent the teeth on the shaft and the teeth in the row from locking at each end of the row of teeth, and means for resilienly pressing the teeth in the row against the teeth on the shaft when the teeth on the shaft are in either of said clearance spaces.

4. Mechanism for connecting electrical components into the main tuner circuitry as described in claim 3 in which the means for pressing said teeth together comprises slots cut in adjacent edges of both strips, at least one spring having two arms extending from adjacent the edges of the strips opposite the edges having the slots and across a side of one strip and diverging away from each other in the direction of the slots and having ends extending through said slots, the slot in the strip having the row of teeth being as long as the row of teeth, the slot in the strip on which the shaft is mounted being less in length than said other slot, whereby when the teeth on said shaft are in the clearance spaces at each end of the row of teeth, an arm of the spring presses against an end of the slot in the strip having the row of teeth and presses the teeth on the strips against each other.

5. Mechanism for connecting electrical components into the main tuner circuitry as described in claim 4 in which the ends of the arms of the spring clip press against the outer surface of the strip on which the shaft is mounted and thereby press the strips toward each other.

6. A tuner strip for use in a tuner of a receiver for radio frequencies, said tuner strip comprising an elongated flat strip of dielectric material having on at least one side and spaced from each other along the side a plurality of components to be connected into the main circuitry of the tuner, contacts positioned on one edge of said strip and connected to said components, said contacts extending outwardly beyond said edge to engage contacts connected into the main tuner circuitry, a second elongated flat strip of dielectric material positioned parallel to and against the first strip and movable lengthwise relative to the first strip and having on one of its sides at least one plate of electrically conductive material, said plate being spaced on the second strip relative to one of the components on the first strip so as to be in operative electrical relationship therewith, a shaft rotatably mounted at one end of the first strip, said shaft extending substantially parallel to the longitudinal axis of the first strip and having a portion extending beyond the end of the strip whereby it may be engaged for rotation, said shaft also having gear teeth, and gear teeth in the second strip engaging the gear teeth on said shaft whereby rotation of the shaft will move the second strip lengthwise relative to the first strip.

References Cited in the file of this patent

UNITED STATES PATENTS

| | | |
|---|---|---|
| 2,657,365 | Lazzery | Oct. 27, 1953 |
| 2,795,700 | Julian | June 11, 1957 |
| 2,832,892 | Slate | Apr. 29, 1958 |

UNITED STATES PATENT OFFICE
CERTIFICATE OF CORRECTION

Patent No. 3,071,742 January 1, 1963

Mogens Wiel Bang

It is hereby certified that error appears in the above numbered patent requiring correction and that the said Letters Patent should read as corrected below.

Column 1, line 70, for "ths" read -- the --; column 2, line 3, for "ony" read -- only --; line 9, for "of" read -- for --; lines 28 and 29, for "whenever, the" read -- whenever the --; column 5, line 42, for "is the" read -- is in the --; line 47, for "capacitors," read -- capacitors. --; column 7, line 50, after "having", insert -- certain ultrahigh frequency channels assigned to it to another locality having --; column 8, line 39, for "resilienly" read -- resiliently --.

Signed and sealed this 27th day of August 1963.

(SEAL)
Attest:

ERNEST W. SWIDER
Attesting Officer

DAVID L. LADD
Commissioner of Patents